US006875669B2

United States Patent
Wang et al.

(10) Patent No.: US 6,875,669 B2
(45) Date of Patent: Apr. 5, 2005

(54) METHOD OF CONTROLLING THE TOP WIDTH OF A DEEP TRENCH

(75) Inventors: Jiann-Jong Wang, Taipei Hsien (TW); Ping Hsu, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/720,327

(22) Filed: Nov. 24, 2003

(65) Prior Publication Data

US 2005/0003625 A1 Jan. 6, 2005

(30) Foreign Application Priority Data

Jul. 3, 2003 (TW) .......................... 92118165 A

(51) Int. Cl.⁷ ................... H01L 21/76; H01L 21/8242
(52) U.S. Cl. ................ 438/424; 438/243; 438/246; 438/386; 438/389; 438/430; 438/431
(58) Field of Search ................ 438/424, 430, 438/431, 386, 389, 243, 246

(56) References Cited

U.S. PATENT DOCUMENTS

| 6,083,787 | A | * | 7/2000 | Lee ........................... 438/243 |
| 6,426,253 | B1 | * | 7/2002 | Tews et al. .................. 438/243 |
| 6,437,381 | B1 | * | 8/2002 | Gruening et al. ........... 257/296 |
| 6,777,303 | B2 | * | 8/2004 | Schrems et al. ............ 438/386 |
| 2002/0024082 | A1 | * | 2/2002 | Tsunashima et al. ........ 257/301 |
| 2004/0241953 | A1 | * | 12/2004 | Wang et al. ................. 438/386 |

* cited by examiner

*Primary Examiner*—Michael Trinh
(74) *Attorney, Agent, or Firm*—Quintero Law Office

(57) ABSTRACT

A method of controlling the top width of a deep trench. A conductive layer is formed on the trench over a substrate of polysilicon with a recessed structure. An additional layer of amorphous silicon (α-Si) is deposited onto the polysilicon. After subsequent oxidation, the amorphous silicon is converted to $SiO_2$. According to the invention, the top width of a deep trench is controlled, protecting bit lines from sub-threshold leakage.

24 Claims, 14 Drawing Sheets

METHOD OF CONTROLLING THE TOP WIDTH OF A DEEP TRENCH

BACKGROUND OF THE INVENTION

1. Field of the Invention

The present invention relates in general to a method of controlling the top width of a deep trench capacitor. In particular, the present invention relates to a method of preventing increased top width of a deep trench.

2. Description of the Related Art

DRAM is readable and writeable memory. Each DRAM cell consists of one transistor and one capacitor, obtaining high integrity compared with other memory types, allowing comprehensive application in computers and electronic products. Currently, plane transistors with deep trench capacitors are designed in a 3-dimensional capacitor structure for the deep trench of the semiconductor substrate, minimizing dimensions and power consumption, and accelerating operating speed.

FIG. 1a is a plane view of the deep trench in a conventional DRAM cell. In folded bit line, each active area includes two word lines ($WL_1$ & $WL_2$) and one bit line (BL), with BC representing a bit line contact, DT a deep trench, and the top width of the deep trench in the bit line direction.

FIG. 1b is a cross section of a deep trench capacitor in a conventional DRAM cell. A semiconductor silicon substrate 10 has a deep trench DT, the lower area of which acting as a deep trench capacitor 12, consisting of a buried plate, a node dielectric, and a storage node. In fabrication of the deep trench capacitor 12, a deep trench DT is formed in the p-type semiconductor substrate 10 using RIE, and $n^+$-type ions are diffused into the lower area of a deep trench DT using a heavy doping oxide, such as ASG, with short duration/high temperature annealing, so that an $n^+$-type diffusion area 14 is formed to act as the buried plate of the deep trench capacitor 12. And a silicon nitride layer 16 is formed at the inner sidewall and bottom of the deep trench DT lower area, acting as the node dielectric of the deep trench capacitor 12. Subsequently, an $n^+$-type doped first polysilicon layer 18 is formed inside the deep trench DT, recessing the first polysilicon layer 18 at a predetermined depth to act as the storage node of the deep trench capacitor 12.

After completion of the above deep trench capacitor 12, a collar dielectric 20 is fabricated on the upper sidewalls of the deep trench DT, then a second polysilicon layer 22 and a third polysilicon layer 24 are sequentially formed on the upper deep trench DT. Subsequently, a STI structure 26, word line ($WL_1$ & $WL_2$), source/drain diffusion area 28, bit line contact (CB), and bit line(BL) processes are formed. The STI structure 26 is formed to isolate the adjacent two DRAM cells.

In order to connect the deep trench capacitor 12 to the surface of the transistor, the buried strap outdiffusion area 30 is formed on the silicon substrate 10 of the deep trench DT top side area, acting as an node junction, and the deep trench capacitor 12 and the above mentioned node junction 30 are connected using the second polysilicon layer 22 and the third polysilicon layer 24 formed in the deep trench DT.

For DRAM, the smaller the feature size, the more important the deep trench dimension becomes. When capacity increases with size of the deep trench DT, process tolerance of overlay with the subsequent Active Area (AA) reduces commensurately, particularly in the overlay margin area L between the source/drain diffusion area 28 and the buried strap outdiffusion area 30, in which serious current leakage results, impacting the performance of the sub-threshold voltage (Vt).

FIGS. 2a–2f are cross sections of the conventional process of employing pullback process on the top of the deep trench, smoothing the subsequent polysilicon layer to fill the deep trench. In FIG. 2a, a formed deep trench capacitor 12 in the p-type semiconductor silicon substrate 10, comprising a collar structure 11, consists of a silicon nitride pad layer 13 and a silicon oxide pad layer 15, a deep trench 17, an $n^+$-type diffusion area 14, a silicon nitride layer 16 and an $n^+$-type doped first polysilicon layer 18. The silicon nitride pad layer 13 at the top of the deep trench 17 is pulled back using heated phosphoric acid, since the pullback to the silicon nitride pad layer 13 has a higher etching rate than the silicon oxide pad layer 15, the structure as in FIG. 2b is formed.

Subsequently, in FIG. 2c, the first silicon oxide layer 34 is formed on the exposed surface of the silicon substrate 10, so that the upper sidewalls of the deep trench 17 are capped, insulating the $n^+$-type diffusion area 14 and the subsequently formed buried strap outdiffusion area 30. And in FIG. 2d, the second silicon oxide layer 36 is formed by CVD, and the portion of second silicon oxide layer 36 on the top of the first polysilicon layer 18 is removed using anisotropic dry etching.

Subsequently, in FIG. 2e, the second polysilicon layer 22 is filled into the deep trench 17, and recesses the second polysilicon layer 22 to a predetermined depth. Eventually, in FIG. 2f, a portion of the first silicon oxide layer 34 and the second silicon oxide layer 36 are removed using wet etching until the top of the second polysilicon layer 22 protrudes, and the remaining first silicon oxide layer 34 and second silicon oxide layer 36 act as a collar dielectric layer 20, effectively insulating the buried strap outdiffusion area 30 and the buried strap 14, thereby preventing current leakage.

Since a portion of the silicon substrate 10 is converted to $SiO_2$ during the first silicon oxide layer 34 deposition, subsequent wet etching increases the top width of the deep trench DT (from S to S'), as in FIG. 3. The overlay tolerance between word line WL and deep trench DT, and the distribution of the buried strap outdiffusion area 30 are thus impacted, especially, shortening the overlay margin area L between the source/drain diffusion area 28 and the buried strap outdiffusion area 30, suffering serious current leakage, and deteriorating the performance of sub-Vt.

When pulling back the collar structure 11 at the top of the deep trench 170 to expose the silicon substrate 10 is a main focus of leading deep trench 170 top width increase, the described step is also very important. Skipping this step, the top width of the deep trench may effectively be prevented from increasing, thus suppressing sub-voltage leakage. The high (exceeding 4:1) aspect ratio of a deep trench 170 induces seam 19 or void when the second polysilicon 22 is filled into the deep trench 170 if collar structure 11 is not pulled back, as in FIG. 2g. Consequently, void or seam formed not only increases impedance of the deep trench capacitor, but also causes deep trench capacitor damage by etching solution or solvent during subsequent chemical cleaning, finally resulting in device breakdown.

Therefore, since pullback is this required, it is critical to prevent top width of a deep trench 17 from increasing.

SUMMARY OF THE INVENTION

Accordingly, an object of the invention is to provide control of a deep trench top width. Based on the conventional process, an additional α-silicon layer is formed on the first polysilicon recessed structure. Since α-silicon is formed by plasma enhanced chemical vapor deposition (PECVD), using requisite tuned recipes to form α-silicon layer with the poor step coverage and non-conformity characteristics, such that the deep trench is thicker at the top than the bottom when α-silicon layer is formed on the recessed polysilicon structure thereof.

Next, subsequent oxidation is performed. When α-silicon is oxidized, unlike the thinner α-silicon deposited at the bottom of the deep trench, the thicker α-silicon at the top of the deep trench provides sufficient thickness of α-silicon for consumption and conversion to $SiO_2$ during oxidation. Thus, the silicon substrate at the top of the deep trench is not converted to $SiO_2$, preventing width increase after subsequent wet etching. The present invention controls top width of the deep trench after oxidation.

DESCRIPTION OF THE DRAWINGS

For a better understanding of the present invention, reference is made to a detailed description to act as read in conjunction with the accompanying drawings, in which.

DETAILED DESCRIPTION OF THE INVENTION

In this specification, "overlying the substrate", "above the layer", or "on the film" denote a relative positional relationship with respect to the surface of the base layer, regardless of the existence of intermediate layers. Accordingly, these expressions may indicate not only the direct contact of layers, but also, a non-contact state between one or more laminated layers.

According to the present invention, after the α-silicon and silicon oxide processes, the method of controlling the top width of the deep trench, comprising: a dielectric layer (collar TEOS) is filled and annealed, etching the dielectric layer to form a collar dielectric layer using anisotropic dry etching, filling a second polysilicon layer and performing chemical mechanical polishing (CMP), and anisotropically etching the second polysilicon and isotropically etching the collar dielectric layer.

Figure 1A:
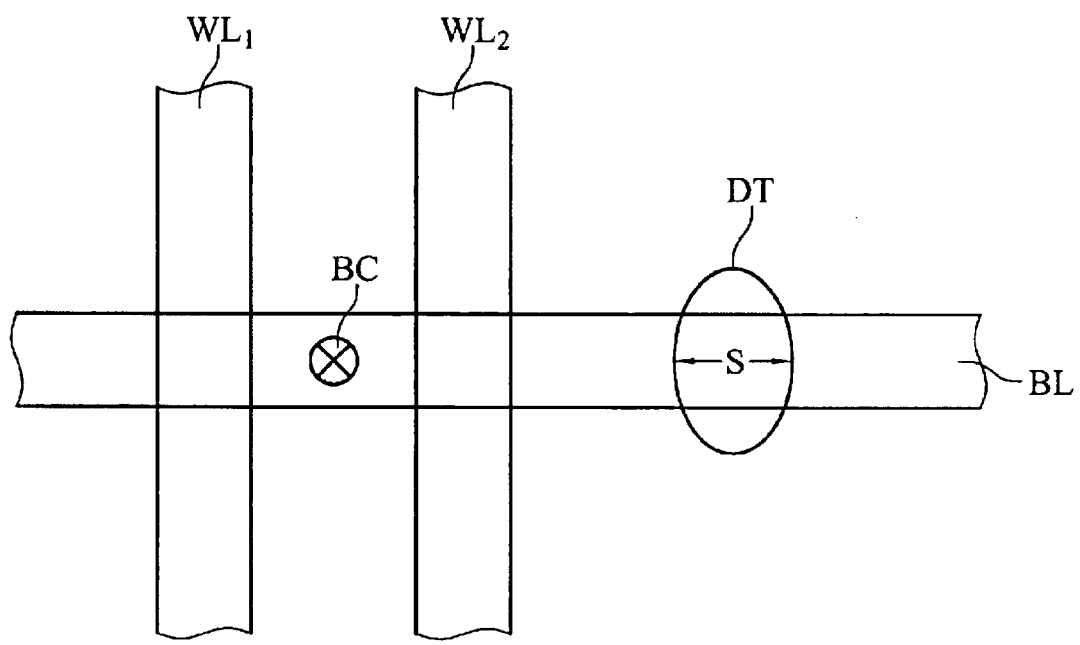
FIG. 1a is plane view of a conventional deep trench of a DRAM cell.
Figure 1B:
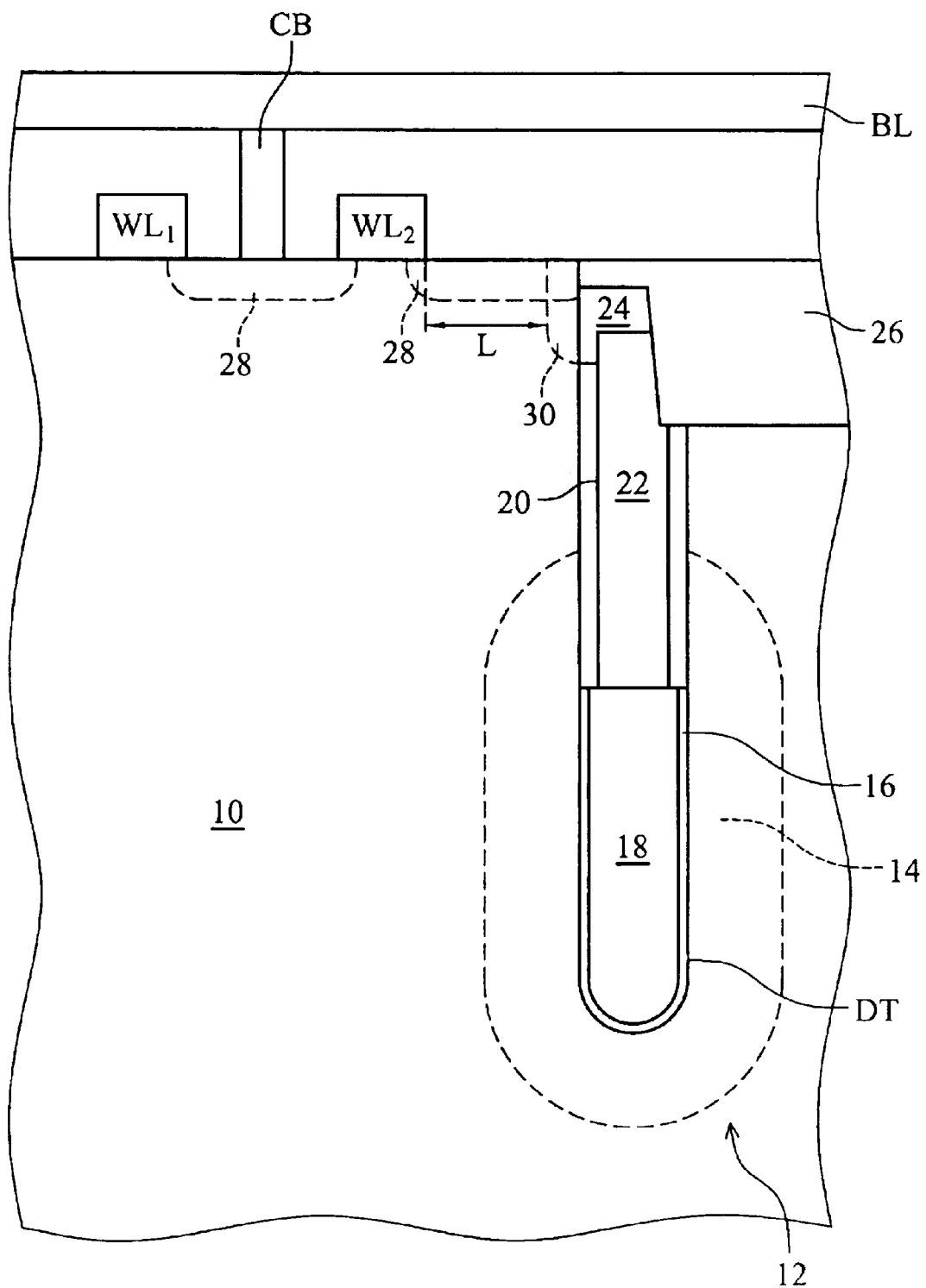
FIG. 1b is a cross section of a conventional deep trench capacitor of a DRAM cell.
Figure 2A:
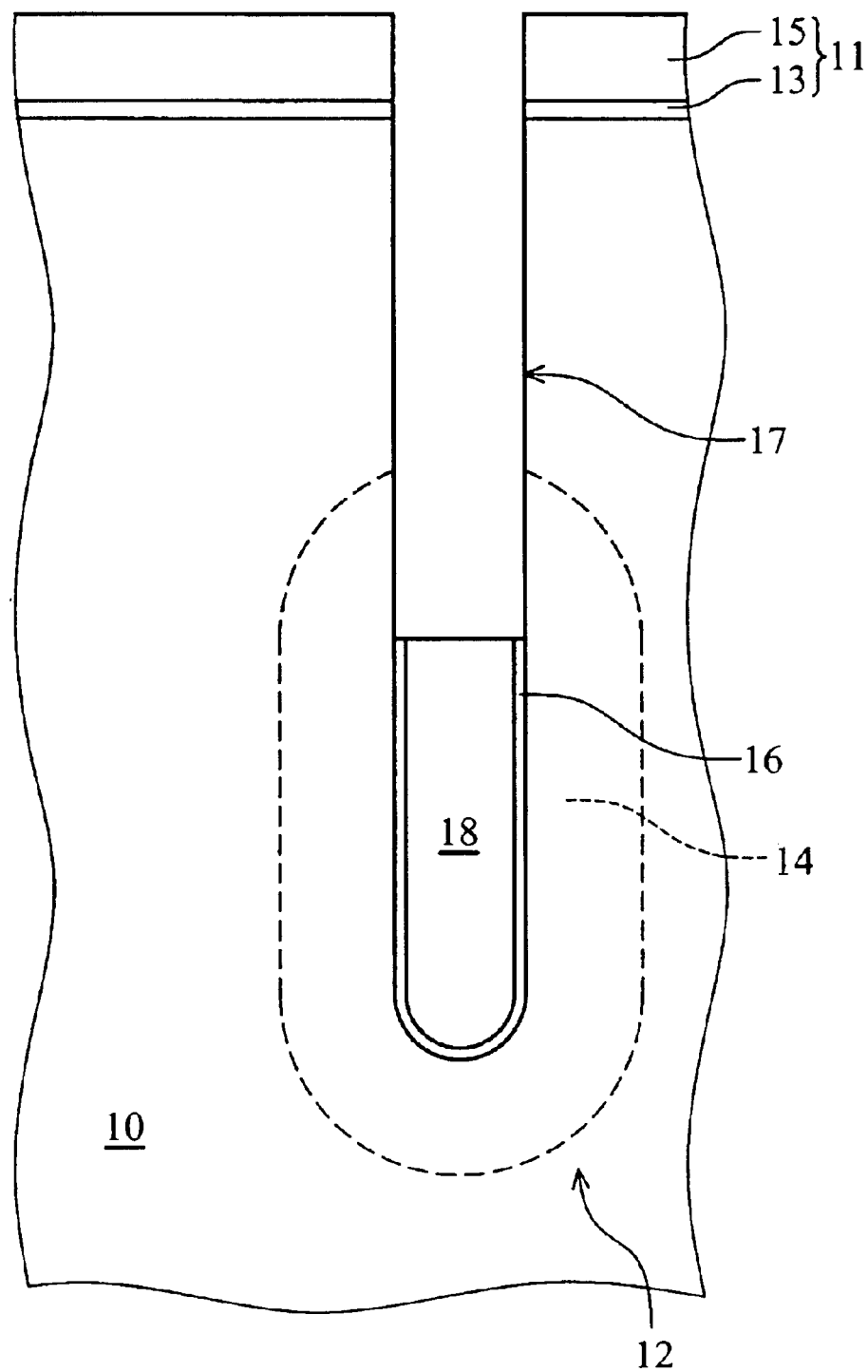
FIGS. 2a~2g are cross sections of fabrication processes of a conventional deep trench capacitor in a DRAM cell.
Figure 2B:
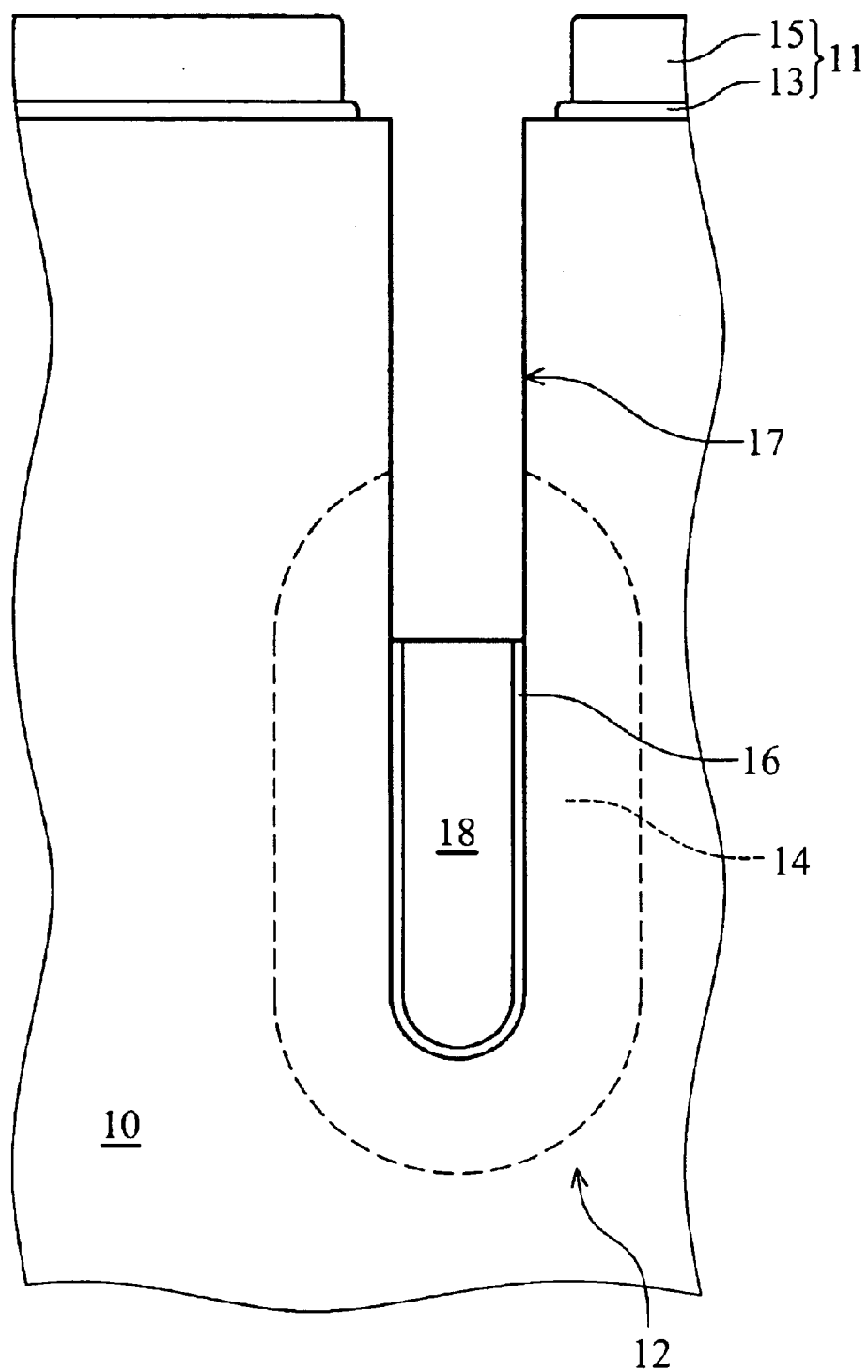
Figure 2C:
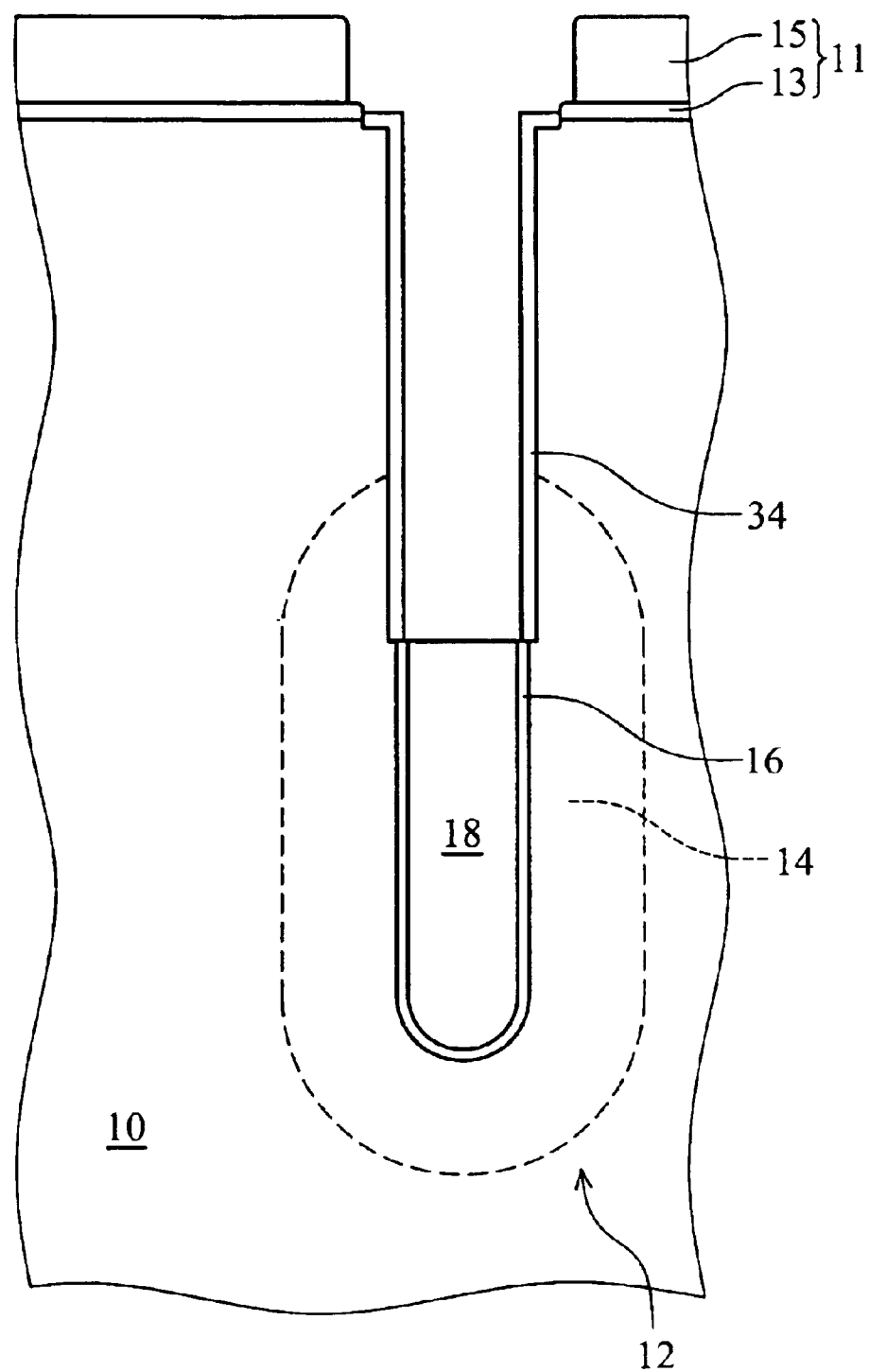
Figure 2D:
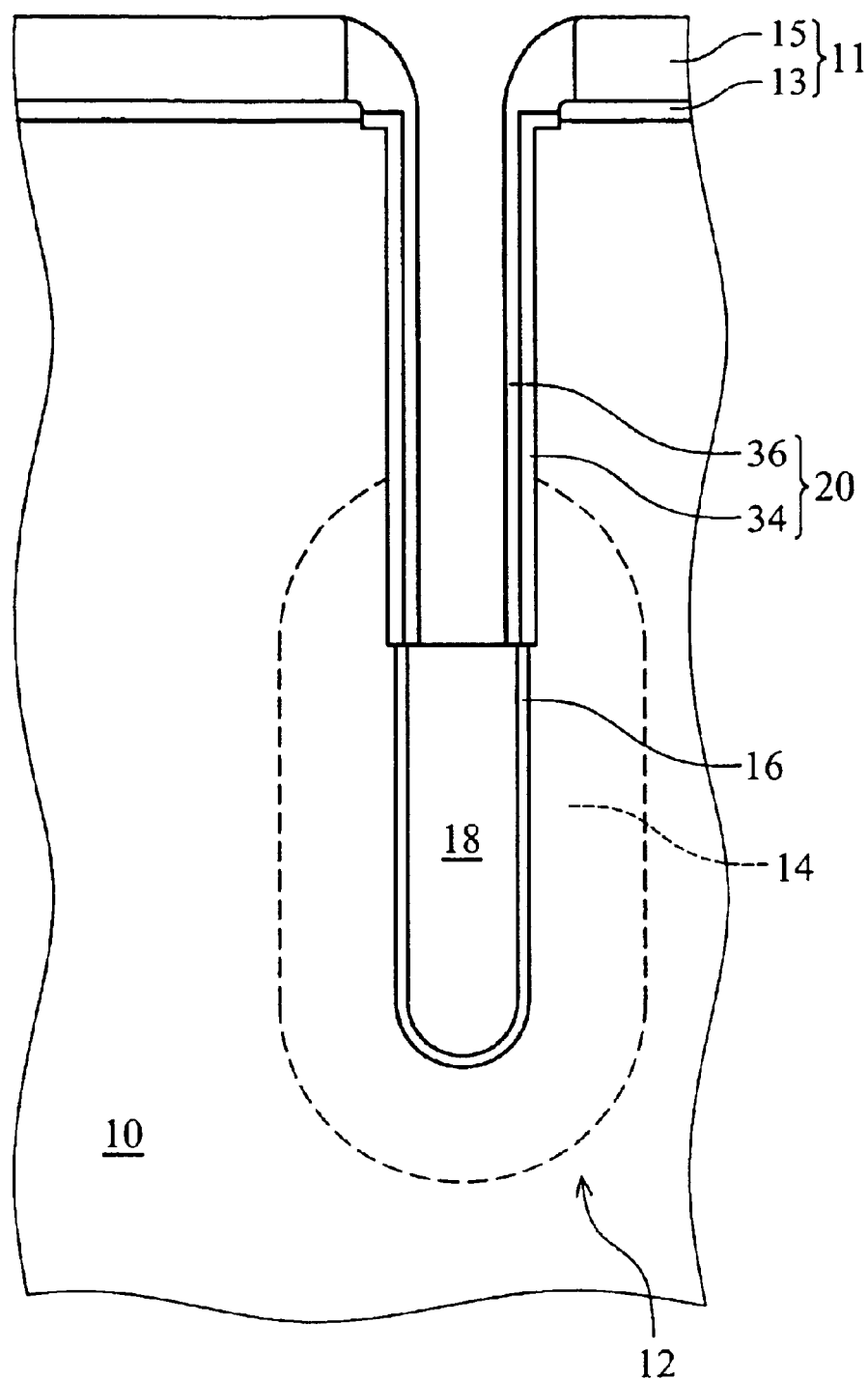
Figure 2E:
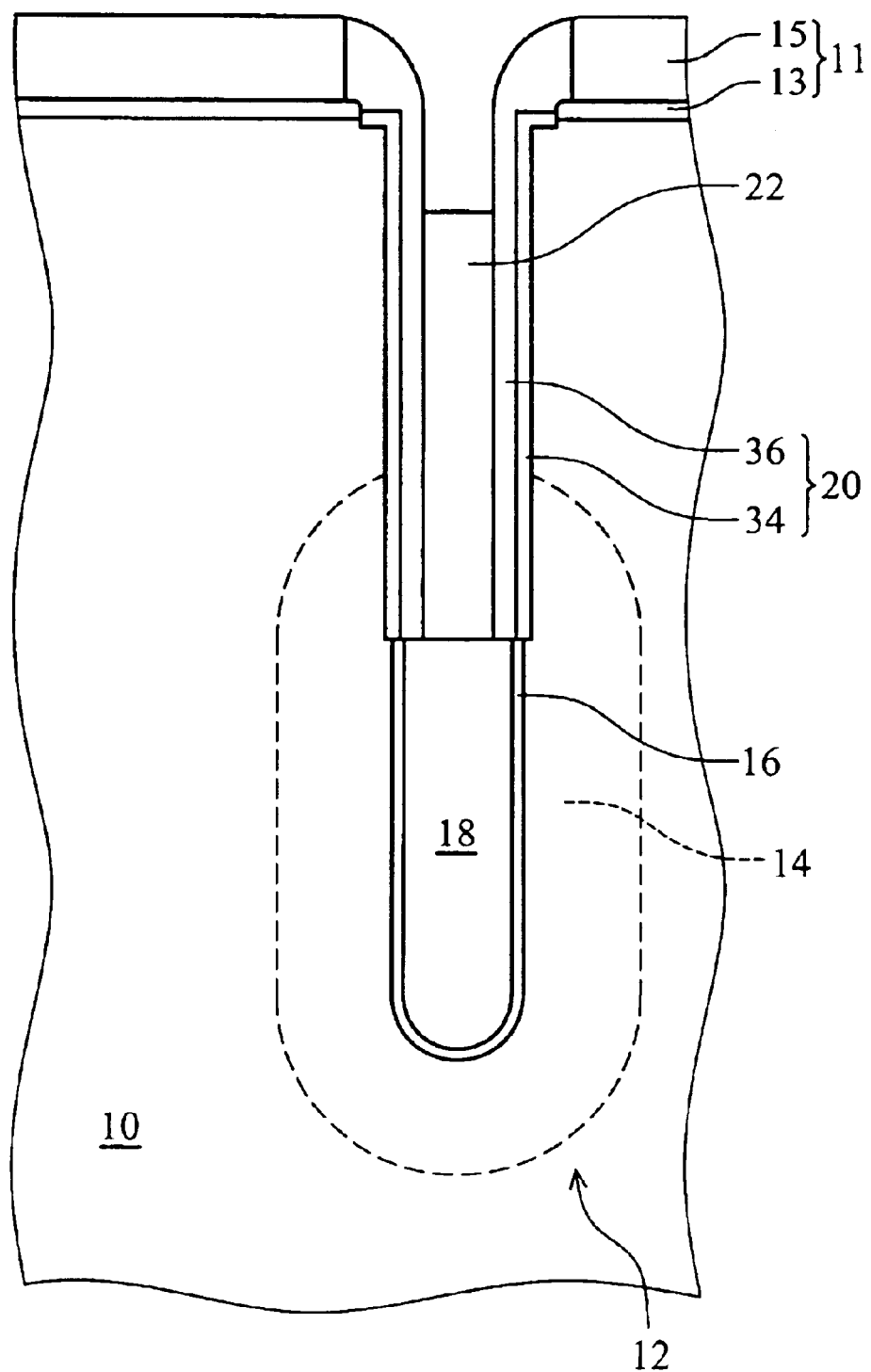
Figure 2F:
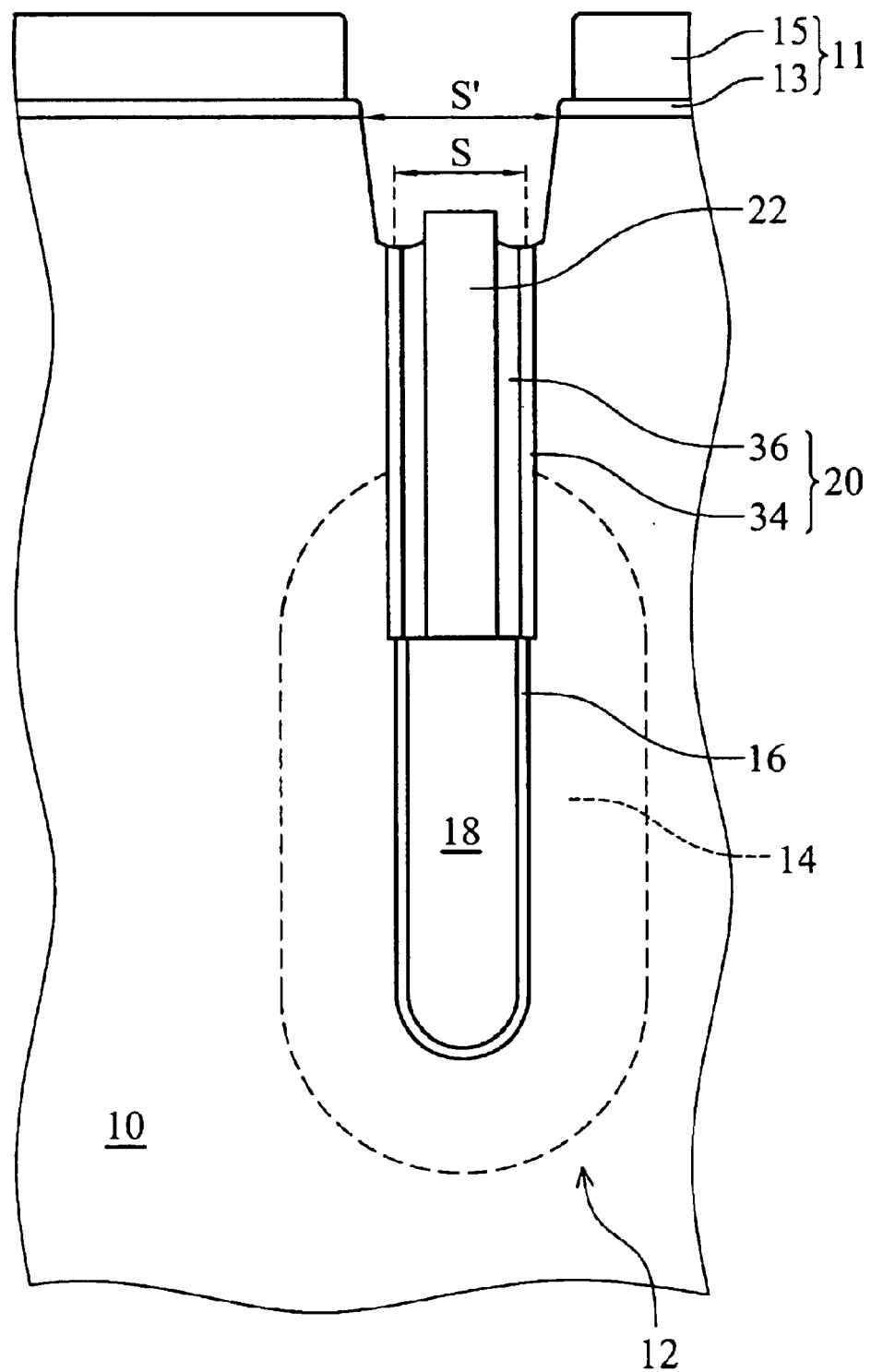
Figure 2G:
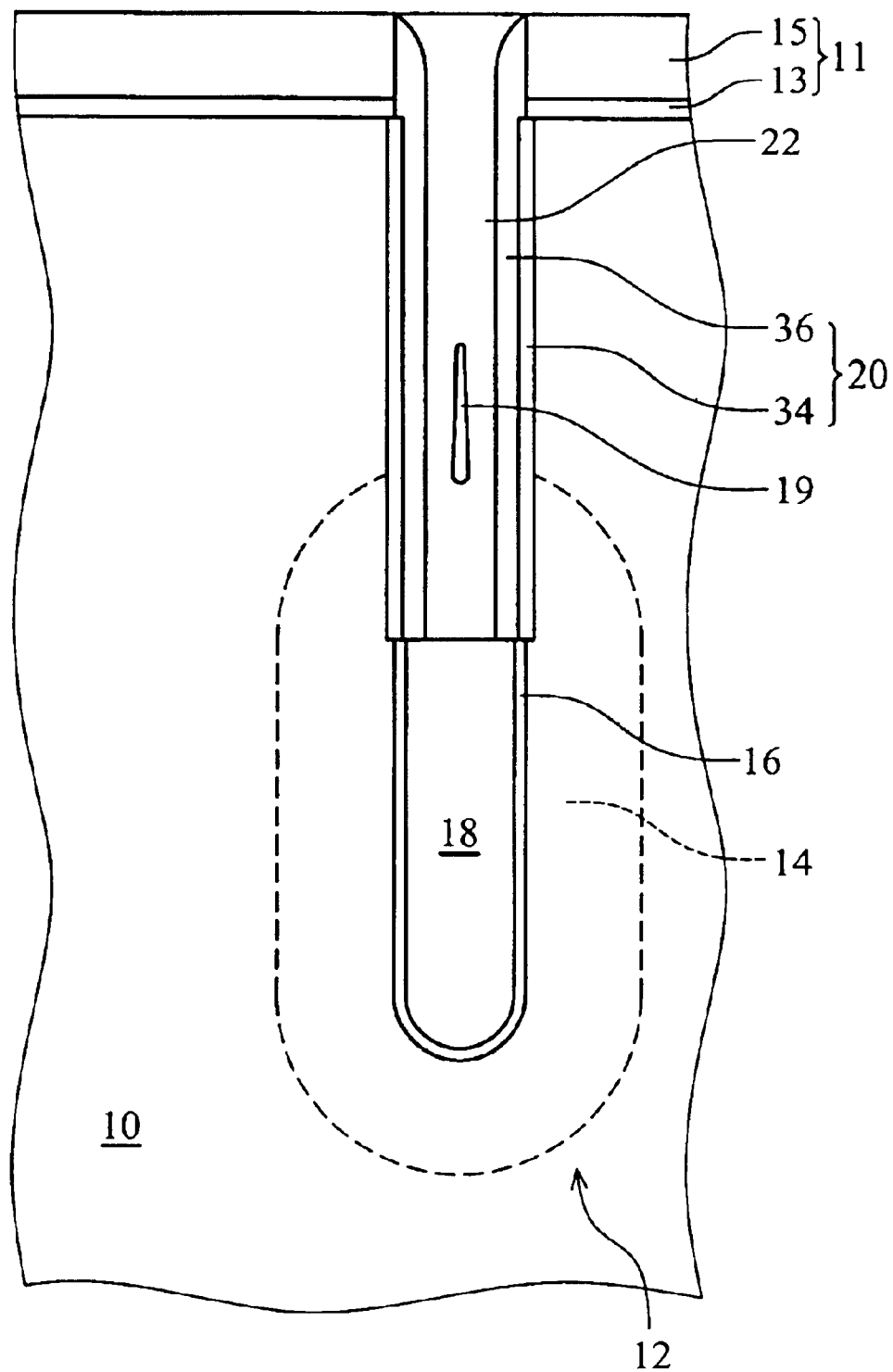
Figure 3A:
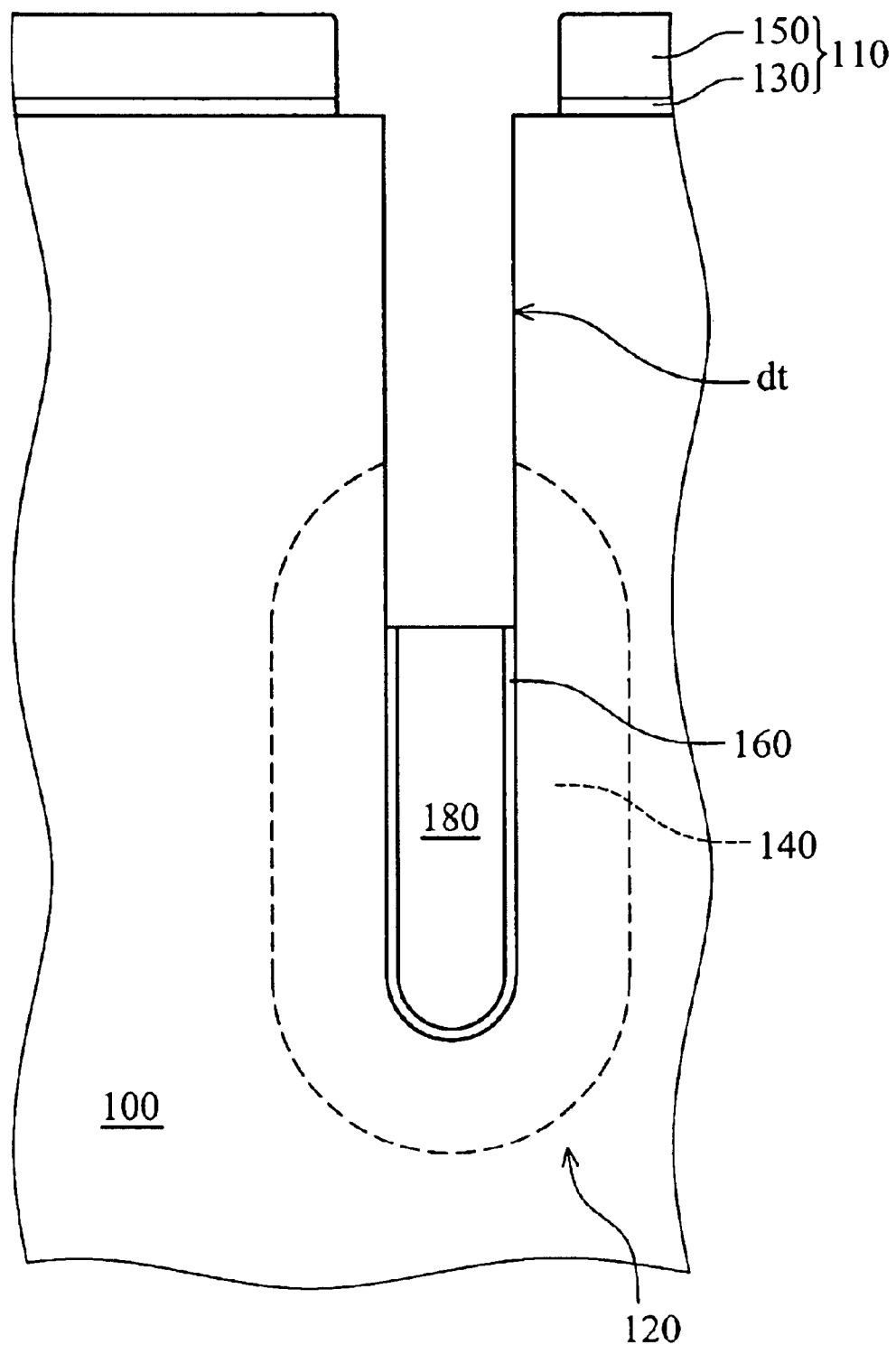
FIGS. 3a~3e are cross sections of the method of controlling the top width of a deep trench according to the present invention.

In FIG. 3a, a semiconductor substrate 100 is provided having a deep trench capacitor 120 formed thereon, consisting of a buried plate 140, a node dielectric layer 160 and a storage node 180. The fabrication of the deep trench capacitor 120 comprises a p-type semiconductor substrate 100 with a deep trench dt formed by photolithography and RIE. A pad layer is formed on the deep trench dt consisting of a pad oxide 130, such as silicon oxide layer, and a pad nitride layer 150, such as silicon nitride layer. Next, the $n^+$-type ions are diffused to the lower area of the deep trench dt using a heavy doped oxide, such as ASG, with high temperature/short duration annealing to form an $n^+$-type diffusion area 140, acting as the buried plate of the capacitor. A nitride layer 160, such as silicon nitride layer, is formed on the inner sidewalls and bottom of the deep trench dt, and an $n^+$-type doped first conductive layer 180, such as polysilicon layer, is formed on the deep trench dt. The first conductive layer 180 and the silicon nitride layer 160 are recessed 600~1400 mm below the surface of the silicon substrate, such that the remaining first conductive layer 180 acts as a capacitor top electrode, and the silicon nitride 160 between the first conductive layer 180 and the $n^+$-type diffusion area 140 acts as a node dielectric layer.

Figure 3B:
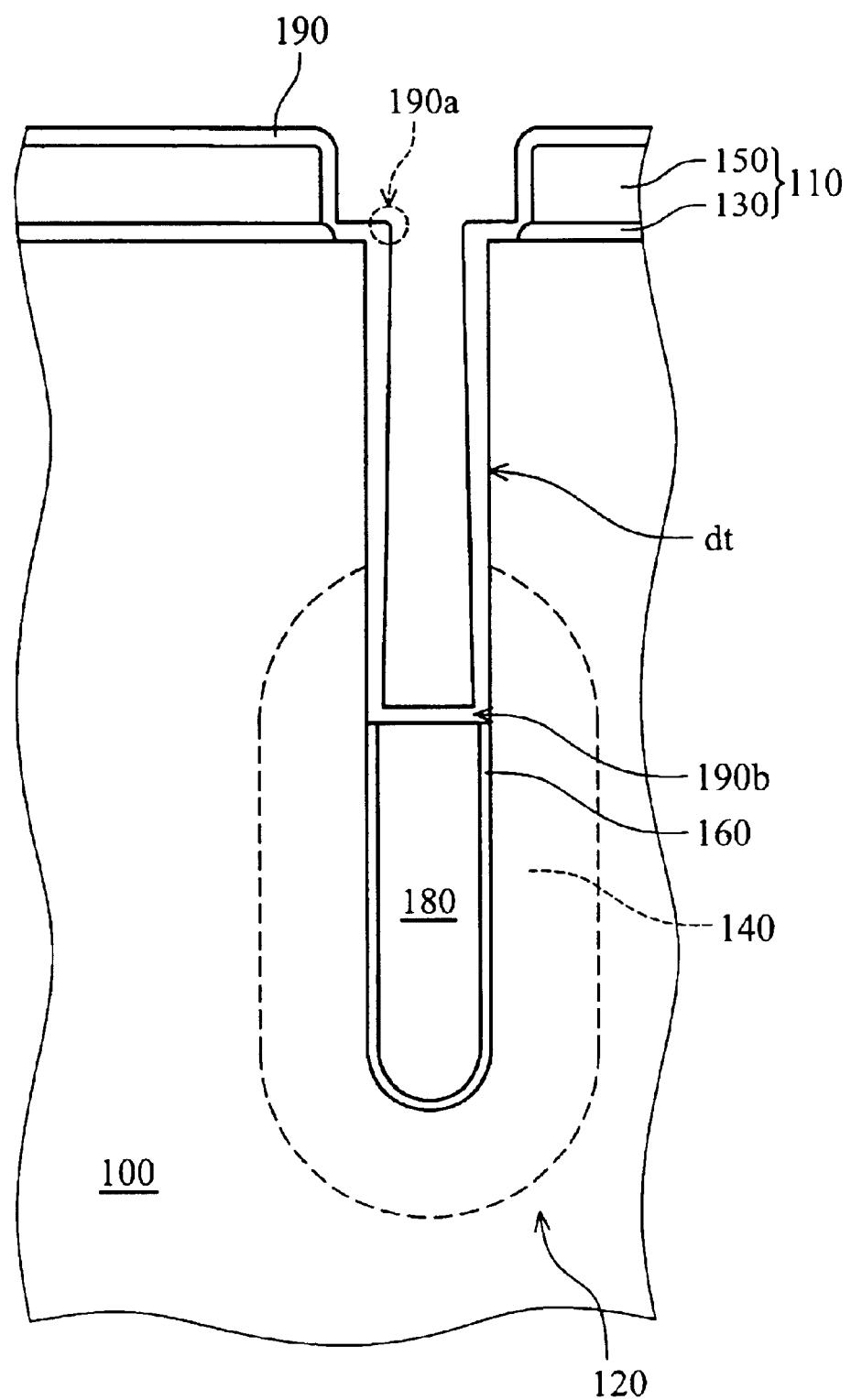

Subsequently, in FIG. 3b, since the aspect ratio of the deep trench dt is higher (exceeding 4:1), a requisite tuned recipe is used to form discontinuous step coverage of α-silicon layer 190 (100~200 Å) on the surface of the pad oxide 130, pad nitride 150, deep trench dt and first conductive layer 180, using PECVD, resulting in increased thickness at the top of the deep trench.

Figure 3C:
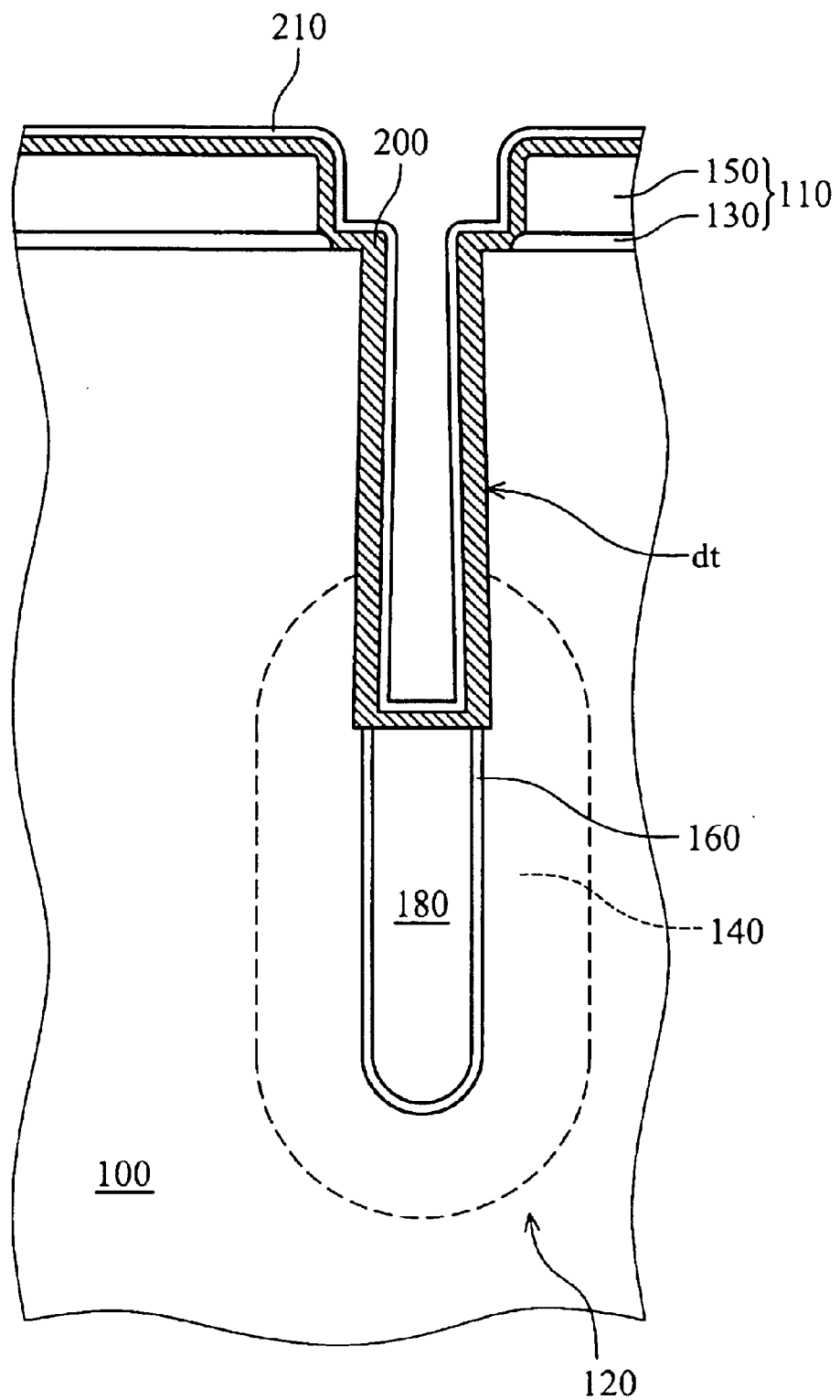

Next, in FIG. 3c, the α-silicon layer 190 is oxidized, by, for example, 900° C./30 sec of thermal oxidation, to create a silicon oxide layer 200, enabling insulating efficiency between $n^+$-type diffusion area 140 and subsequent buried strap outdiffusion area 30. The α-silicon 190 is oxidized to silicon oxide 200 during thermal oxidation, in addition, α-silicon at the top of a deep trench dt is thicker than at the bottom, providing sufficient thickness for consumption and conversion to $SiO_2$, controlling the top width of the deep trench after subsequent wet etching.

Next, a dielectric layer 210, such as TEOS, with thickness of 300 Å, is formed on silicon oxide 200 using CVD to protect the capacitor from current leakage, and the dielectric layer 210 is then annealed to densify the material.

Figure 3D:
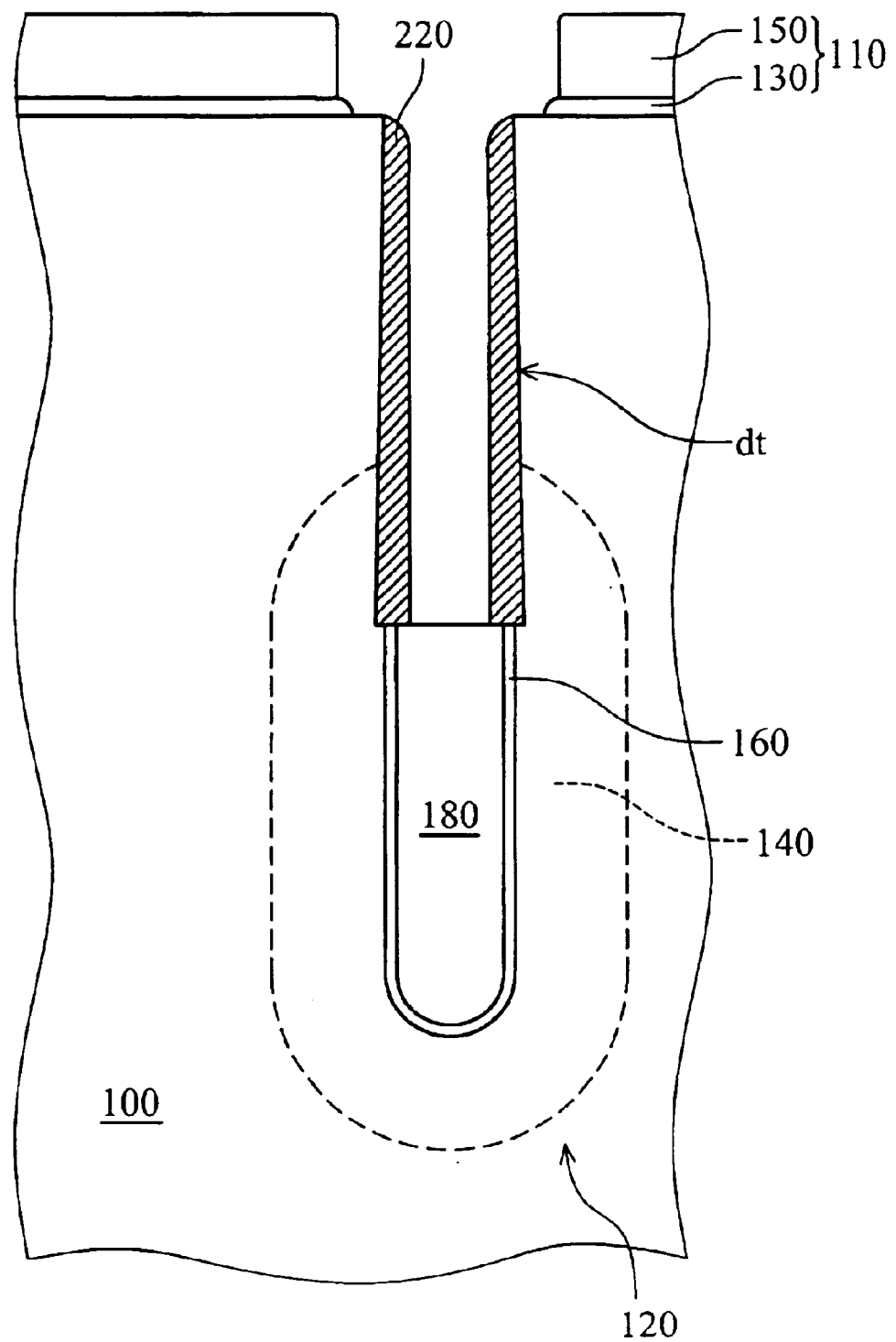

Subsequently, in FIG. 3d, the dielectric layer 210 is etched using anisotropic dry etching to remove the dielectric layer 210 and a portion of the silicon oxide 200 etching stop by the first conductive layer 180 surface, such that collar dielectric layer 220 is formed.

Figure 3E:
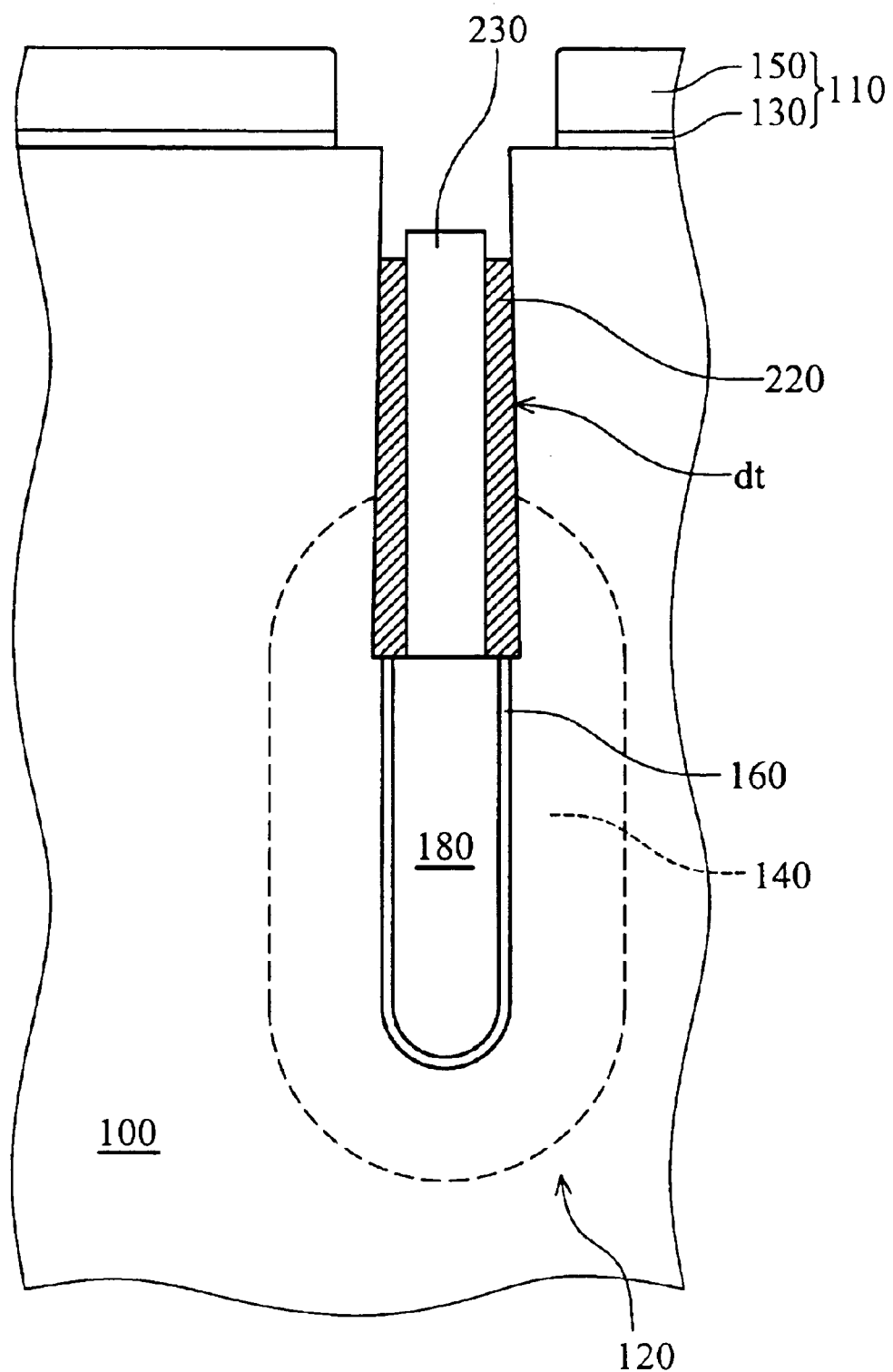

In FIG. 3e, an $n^+$-type doped second conductive layer 230 of 2000 Å, such as polysilicon, is filled into the deep trench dt connecting with the first conductive layer 180. The second conductive layer 230 is then polished level with the silicon oxide 200, using CMP and etched to a predetermined depth. Finally, the top portion of the collar dielectric layer 220 is removed using wet etching to expose the second polysilicon layer 230. The etchant, such as BOE acid solution, removes the collar dielectric layer 220.

In conclusion, the present invention provides a method of first forming and then converting α-silicon 190 to silicon oxide 200 upon oxidization. Unlike the bottom α-silicon, the thicker α-silicon formed at the top of the deep trench provides sufficient thickness for oxidization, keeping the silicon substrate at the top of the deep trench from converting to silicon oxide 200 during oxidation and subsequently widening.

Although the present invention has been particularly shown and described above with reference to the preferred embodiment, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of controlling the top width of a deep trench, comprising the steps of:

provid a substrate having a trench therein;

forming a first conductive layer filling a portion of the trench;

forming a α-silicon layer on the sidewall of the trench and the first conductive layer, wherein the α-silicon is thicker at the top of the trench than elsewhere;

oxidizing the α-silicon layer to form a silicon oxide layer;

forming a dielectric layer on the silicon oxide layer, and anisotropically etching the dielectric layer and the silicon oxide layer to form a collar dielectric layer on the sidewalls of the trench;

forming a second conductive layer to fill the trench, wherein the upper surface of the second conductive layer is lower than the opening of the trench; and recessing the collar dielectric layer below the second conductive layer such that the substrate surface at the sidewall of the trench is exposed.

2. The method of controlling the top width of a deep trench as claimed in claim 1, wherein the substrate is a single crystal silicon substrate.

3. The method of controlling the top width of a deep trench as claimed in claim 1, formation of the first conductive layer further comprising:

depositing the conductive layer on the substrate and filling into the trench; and etching back the conductive layer to form a recess in the trench.

4. The method of controlling the top width of a deep trench as claimed in claim 3, wherein the conductive layer is formed by chemical vapor deposition.

5. The method of controlling the top width of a deep trench as claimed in claim 3, wherein the conductive layer is etched by anisotropic dry etching.

6. The method of controlling the top width of a deep trench as claimed in claim 1, wherein the first conductive layer is an n$^+$-type doped polysilicon.

7. The method of controlling the top width of a deep trench as claimed in claim 1, the trench further comprising a capacitor and the conductive layer acting as a top electrode of the capacitor.

8. The method of controlling the top width of a deep trench as claimed in claim 1, wherein the α-silicon is thicker at the top than the bottom.

9. The method of controlling the top width of a deep trench as claimed in claim 8, wherein the thicker α-silicon at the top of the trench is formed by chemical vapor deposition.

10. The method of controlling the top width of a deep trench as claimed in claim 1, the steps of forming the second conductive layer further comprising:

depositing the conductive layer on the substrate and filling into the trench; and etching back the conductive layer to form a recess in the trench.

11. The method of controlling the top width of a deep trench as claimed in claim 1, wherein the dielectric layer is TEOS oxide.

12. The method of controlling the top width of a deep trench as claimed in claim 1, wherein a portion of the silicon oxide and the collar dielectric is removed by wet etching.

13. A method of controlling the top width of a deep trench, comprising the steps of:

providing a semiconductor silicon substrate having a trench therein, and filling a first conductive layer in a portion of the trench;

forming a α-silicon layer on the sidewall of the trench and the first conductive layer, with α-silicon at the top of the trench being thicker than elsewhere;

oxidizing the α-silicon layer to form a silicon oxide layer;

forming a dielectric layer on the silicon oxide layer, and anisotropically etching the dielectric and silicon oxide layer to form a collar dielectric layer on the sidewall of the trench;

forming a second conductive layer filling into the trench, wherein the upper surface of the second conductive layer is lower than the opening of the trench, and;

removing a portion of the collar dielectric layer, forming a surface lower than the second conductive layer.

14. The method of controlling the top width of a deep trench as claimed in claim 13, wherein the substrate is a single crystal silicon substrate.

15. The method of controlling the top width of a deep trench as claimed in claim 13, formation of the first conductive layer further comprising:

depositing the conductive layer on the substrate and filling the trench; and etching back the conductive layer to form a recess in the trench.

16. The method of controlling the top width of a deep trench as claimed in claim 15, wherein the first conductive layer is formed by chemical vapor deposition.

17. The method of controlling the top width of a deep trench as claimed in claim 13, wherein the first conductive layer is etched by anisotropic dry etching.

18. The method of controlling the top width of a deep trench as claimed in claim 13, wherein the first conductive layer is an n$^+$-type doped polysilicon.

19. The method of controlling the top width of a deep trench as claimed in claim 13, the trench further comprising a capacitor and the conductive layer acting as a top electrode of the capacitor.

20. The method of controlling the top width of a deep trench as claimed in claim 13, wherein the α-silicon is thicker at the top than the bottom.

21. The method of controlling the top width of a deep trench as claimed in claim 20, wherein the thicker α-silicon is formed by chemical vapor deposition.

22. The method of controlling the top width of a deep trench as claimed in claim 13, the steps of forming the second conductive layer further comprising:

depositing the conductive layer on the substrate and filling into the trench; and etching the conductive layer to form a recess in the trench.

23. The method of controlling the top width of a deep trench as claimed in claim 13, wherein the dielectric layer is TEOS oxide.

24. The method of controlling the top width of a deep trench as claimed in claim 13, wherein a portion of the silicon oxide and the collar dielectric is removed by wet etching.

* * * * *